Figure 1:
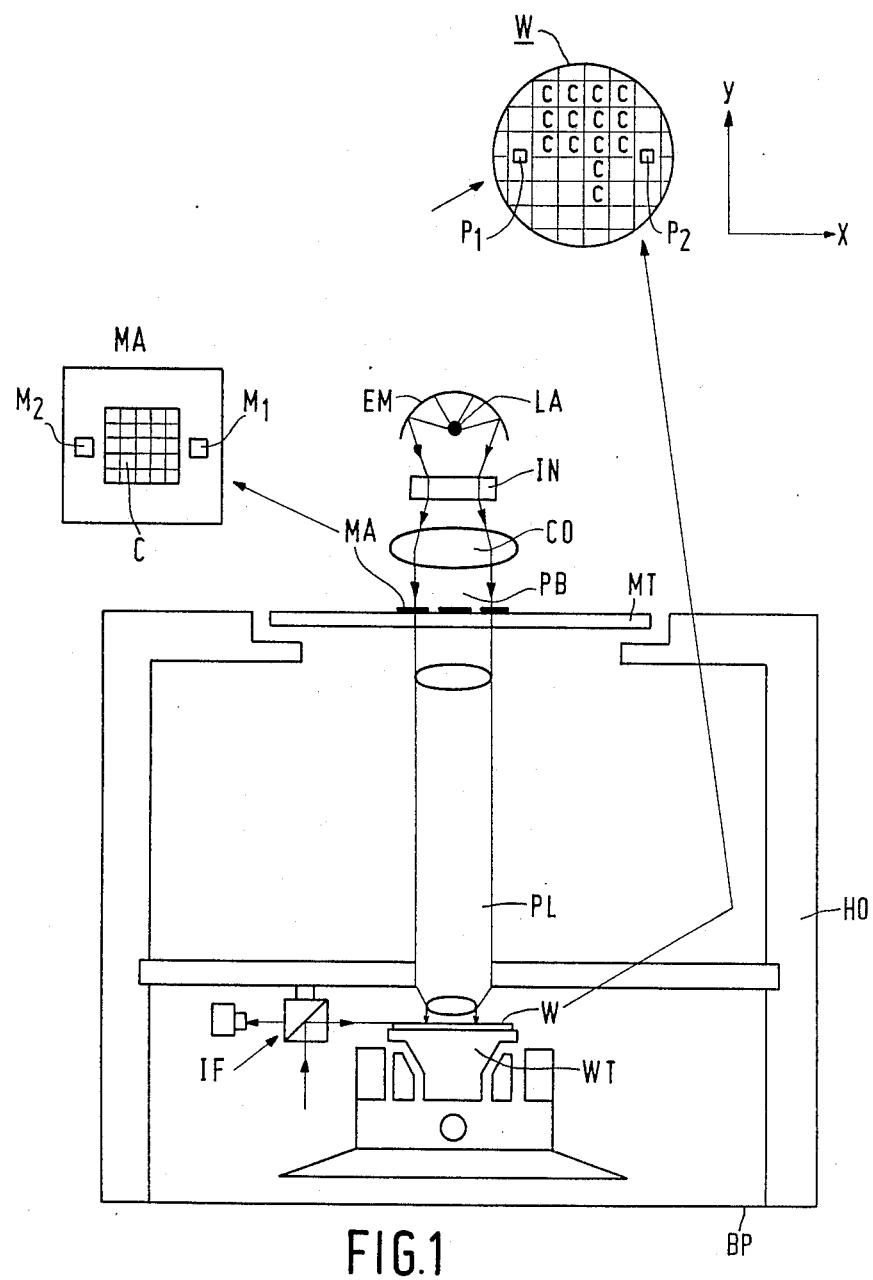

United States Patent [19]

Bouwhuis et al.

[11] Patent Number: 4,772,119
[45] Date of Patent: Sep. 20, 1988

[54] DEVICE FOR DETECTING A MAGNIFICATION ERROR IN AN OPTICAL IMAGING SYSTEM

[75] Inventors: Gijsbertus Bouwhuis; Antonius H. Akkermans; Guido C. Van De Looy, all of Eindhoven, Netherlands

[73] Assignee: U.S. Philips Corp., New York, N.Y.

[21] Appl. No.: 918,758

[22] Filed: Oct. 14, 1986

[30] Foreign Application Priority Data

May 21, 1986 [NL] Netherlands ............... 8601278

[51] Int. Cl.⁴ ................................. G01B 9/00
[52] U.S. Cl. ..................... 356/124; 356/356
[58] Field of Search ............ 356/124, 356, 401

[56] References Cited

U.S. PATENT DOCUMENTS 4,577,968 3/1986 Makosch ............... 356/356
4,629,313 12/1986 Tanimoto ............... 356/401
4,631,416 12/1986 Turtna, Jr. ............ 356/356

Primary Examiner—R. A. Rosenberger
Assistant Examiner—Crystal Cooper
Attorney, Agent, or Firm—Robert T. Mayer

[57] ABSTRACT

A device is described for detecting a magnification error in an optical imaging system comprising a lens system ($L_1$, $L_2$) which is telecentric at one side. Two gratings ($RG_1$, $RG_2$) arranged in the object plane (MA) are imaged onto two gratings ($WG_1$, $WG_2$) arranged in the image plane (W; WT) and the radiation beams ($b_1$, $b_2$) by means of which these images are formed are incident on two radiation-sensitive detection systems ($D_1$, $D_2$) which supply periodic signals ($S_1$, $S_2$). By phase comparison of these signals a magnification error ($S_{ME}$) and, if desired, a focussing error can be measured very accurately.

18 Claims, 9 Drawing Sheets

DEVICE FOR DETECTING A MAGNIFICATION ERROR IN AN OPTICAL IMAGING SYSTEM

The invention relates to a device for detecting a magnification error in an optical imaging system comprising a main lens system for conjugaing an object plane and an image plane to each other, which main lens system is telecentric at one side.

In general, such a device may be employed in an imaging system by means of which an object of extremely fine detail is to be imaged without dimensional errors and is particularly suitable for use in an apparatus for repeatedly imaging a mask pattern on a substrate, which apparatus is employed in the fabrication of integrated circuits or ICs.

Such an apparatus, often referred to as "Wafer stepper" in the literature, is described in the article "Optical Aspects of the Silicon Repeater" in "Philips' Technical Review", 41, 1983+84, No. 9, pages 268-278. This article describes an apparatus for imaging a mask pattern, for example the pattern of an integrated circuit, repeatedly and to a reduced scale on the same substrate, the mask pattern and the substrate being moved relative to each other in two mutually perpendicular directions in a plane parallel to the substrate plane and the mask plane between two successive exposures.

Integrated circuits are fabricated by means of diffusing and masking techniques. In this process a plurality of masks having different mask patterns are successively imaged at the same location on a semiconductor substrate. Between consecutive imagings at the same locations the substrate must be subjected to the desired physical and chemical changes. For this purpose, after it has been exposed by a first mask pattern, the substrate must be removed from the apparatus and, after it has been subjected to the desired process steps; it should be replaced therein at the same location in order to expose it by a second mask pattern etc. During this process care must be taken that the image of the second mask pattern and of the succeeding mask patterns are positioned accurately relative to the substrate.

Diffusion and masking techniques can also be employed in the fabrication of other structures with details having dimensions of the order of micrometers. Examples of these are structures of integrated optical systems or conduction and detection patterns of magnetic-domain memories.

In view of the multitude of electronic components per unit area of the substrate and the resulting small dimensions of these components, increasingly stringent requirements are imposed on the accuracy with which integrated circuits are fabricated. Therefore, the repeated imaging of a mask pattern on a substrate requires the use of a projection lens system of a very high quality. The known apparatus described in the above article employs a projection lens system which is telecentric at two sides, that is a system which is telecentric both at the object side or mask side and at the image side or substrate side. A lens system is telecentric at a specific side if at this side the plane of the pupil, that is the entrance pupil or the exit pupil, is situated at infinity. This means that the image of the actual pupil, which image is formed by the lens elements which at this side are situated before the actual pupil, is situated at infinity. At a telecentric side of the lens system the chief ray of a beam, that is the ray passing through the center of the pupil, is always incident perpendicularly relative to the object plane or image plane corresponding to this side. In the known projection apparatus, which comprises a lens system which is telecentric at both sides and whose object plane coincides with the plane of the mask pattern and whose image plane coincides with the substrate surface in the ideal case, a displacement along the optical axis of the mask pattern or of the substrate relative to the projection-lens system will not result in a magnification error.

The apparatus for the repeated imaging of mask patterns, described in the aforementioned article in "Philips' Technical Review", 41, No. 9, pages 268-279, has proved to be very suitable for the repeated formation of images with a specific image format and with minimal details or line widths of the order of one micrometer or larger. However, there is an increasing demand for integrated circuits providing more electronic functions. Such circuits not only cover a larger surface area but their components have even smaller dimensions. Therefore, there is a growing need for an apparatus which is capable of making repeated images whose image format is larger and whose details or line widths are smaller than one micrometer. The projection lens system for such an apparatus is required to have a very high resolution, whilst the image field should be comparatively large, for example of a diameter of the order of 23 mm. Such a lens system, which has recently become available, is telecentric at the image side but not at the object side.

When this projection-lens system is employed, a problem which until now was not serious may play an important part. This problem is that the performance of the lens system depends on ambient influences. In the case of varying ambient parameters, specifically air pressure, the relative refractive indices in the projection-lens system may change to such an extent that the magnification of this system changes. Thus, the need arises to detect the magnification error in order to enable it to be corrected.

In addition to the magnification error which arises as a result of deviations in the projection lens system itself, it is also possible that during imaging of the mask pattern onto the substrate dimensional errors will arise which have the same effect as magnification errors. These dimensional errors may result from dimensional variations in the mask pattern caused by temperature variations and mask deformations and from thermal expansion of the suspension means of the projection-lens system and the mask in the exposure apparatus. Moreover, dimensional variations in the substrate, which also play part in the known apparatus, also exert a substantial influence on the quality of the mask-pattern image.

The problem of a varying magnification under the influence of ambient conditions may also occur in other optical systems by means of which regular patterns must be imaged with a high dimensional accuracy.

Usually several apparatuses of the type intended here for the repeated imaging of a mask pattern onto a substrate, also referred to as exposure apparatuses, will be installed in a plant for the fabrication of integrated circuits. It may be desirable, for example, to carry out the exposures required for the various process steps of a specific substrate by means of different apparatuses. Also when it is in principle the intention that the individual exposures of a substrate be carried out by means of the same exposure apparatus, it should be possible to change to another apparatus if the first apparatus requires maintenance or has become defective. When a plurality of exposure apparatuses are used for the same substrate it should be possible to make the imaging dimensions of these apparatuses equal to one another.

A substantial length of time may elapse between a first exposure and a subsequent exposure of the same substrate by means of the same exposure apparatus. In the meantime the magnification of this apparatus may have changed. It should then be possible to adjust the magnification of the apparatus to the same value with which the structure already formed on the substrate has been imaged.

In general, the exposure apparatus should have a possibility of adjusting the magnification in order to ensure that the image dimensions of the successive images formed on the substrate by means of the same apparatus or a plurality of apparatuses are the same. In order to enable such an adjustment to be carried out, it should be possible to detect a magnification error.

It is the object of the present invention to provide a device for generating a magnification-error signal, which signal can be used as a control signal in a servo system for eliminating this magnification error. The device in accordance with the invention is characterized by a first and a second object grating which are arranged in the object plane and which are intended to be imaged by the main lens system on a first and a second image grating respectively, which image gratings are arranged in the image plane and have a grating period proportional to that of the associated object grating, by a radiation source for illuminating the gratings, and by a first and a second radiation-sensitive detection system respectively arranged in the path of an illumination beam originating from the first object grating and the first image grating and in the path of an illumination beam originating from the second object grating and the second image grating, for converting these beams into periodic electric signals whose phase differences are representative of the magnification error.

If the magnification with which the main lens system images the object gratings onto the image gratings, or vice versa, is correct, the images of the object gratings are exactly in register with the image gratings. This is not the case if the magnification is not correct and a moiré pattern of dark and bright bands will appear behind the gratings, the period of this pattern depending on the degree to which the images of the object grating are in register with the image gratings. If the magnification changes the frequency of the moiré pattern, that is the number of bands per unit of length will vary, so that the bands apparently move relative to the associated stationary radiation-sensitive detection systems whose radiation-sensitive surfaces have a width smaller than that of the moiré bands.

In order to enable the magnification error to be determined very accurately and independently of all kinds of possible variations in the measuring system, such as intensity variations of the radiation source, local reflection or transmission differences in the gratings, or other optical components, care is taken that the detector signals are periodic signals which vary in time and whose phase differences depend on the magnification error. By measuring the phase differences positional deviations smaller than one period of the grating can be determined. Phase differences can be determined very accurately by electronic means as a result of the high degree of interpolation which is possible.

In order to obtain the periodic detector signals the device in accordance with the invention may be characterized further in that the grating lines or strips of an object grating and those of an associated image grating are moved periodically relative to each other in a direction perpendicular to the longitudinal direction of the grating lines or strips.

Owing to this periodic movement the moiré pattern of two associated gratings will move periodically relative to the detection system associated with these gratings. After every displacement of the effectively moving grating over a distance equal to its grating period the signal from this detection system has passed through a maximum and a minimum. If the grating period is sufficiently small the detector signal will be substantially sinusoidal. If the period of the moiré pattern is infinitely large, that is if the gratings are imaged onto each other with the correct magnification, the detector signals will be in phase. If the magnification is not correct, phase differences between the detector signals will occur.

In order to obtain the periodic movement of the grating strips of the object grating and the image grating relative to each other, the device may be characterized by a drive means for one of two associated object and image gratings for periodically moving said gratings relative to each other.

In this embodiment it is, in principle, adequate to use only one radiation sensitive detector for each grating pair. However, the situation may occur that the detector signals are in phase although the image gratings are shifted by roughly one whole grating period relative to the associated grating. In order to mitigate this drawback, the present embodiments of the invention may be characterized further in that at least one of the detection systems comprises two detectors, a phase difference between the output signals of these detectors indicating a coarse magnification error which corresponds to a displacement of the grating strips of a grating relative to those of a grating imaged thereon by at least half a grating period. This step enables a pre-adjustment of the magnification to be obtained. Moreover, in the case of a displacement of the imaged grating relative to an associated grating by, for example, three quarters of the grating period, the sign of the magnification error can be determined.

A preferred embodiment of the invention, in which two associated gratings are moved relative to one another, is characterized in that the grating to be moved and the associated radiation-sensitive detection system together comprise an array of radiation-sensitive detectors, which array covers m grating periods of the grating imaged thereon and comprises n detectors for every grating period and in that each detector of the sequence number i is interconnected to a detector of the sequence number i+n, where i=1, 2, 3, ... n(m−1).

By applying a special electronic processing of the detector signals it is possible to simulate a moving grating and eventually two signals can be obtained whose phase difference depends on the magnification error.

The device in accordance with the invention may operate in the transmission mode or in the reflection mode. The device which operates with transmitted radiation is characterized in that the object gratings and the image gratings are transmission gratings, and in that the radiation source is arranged at one side of the main lens system before the gratings disposed at this side, and the radiation-sensitive detection systems at the other side of this lens system are arranged behind the gratings disposed at this other side.

The device which operates with reflected radiation is characterized in that either the image gratings or the object gratings are reflection gratings and the other gratings are transmission gratings, in that the radiation-sensitive detection systems are arranged at that side of the transmission gratings which is remote from the reflection gratings, and in that in each of the illumination beams a beam splitter is arranged for separating from the illumination beam a radiation beam which originates from the reflection grating and which has twice traversed the main lens system and for directing the second-mentioned beam towards the radiation-sensitive detection system.

In the embodiments described so far the illumination beams have a comparatively large aperture angle, such that the sub-beams diffracted in various diffraction orders by the gratings overlap each other and are not detected separately.

Another category of embodiments have the common characteristic feature that the illumination beams have an aperture angle which is smaller than the diffraction angle at which the first-order sub-beams are diffracted by the gratings and in that for each illumination beam there are provided at least two radiation-sensitive detectors, the first detector being arranged in the path of both the (0,+1)-order sub-beams and one of the (+1,0)- and (+1,−1)-order sub-beams, whilst the other detection is arranged in the path of both the (0,−1)-order sub-beam and one of the (−1,0) and (−1,+1)-order sub-beams, the first and the second numeral referring respectively to the first and the second grating in the radiation path of the relevant illumination beam.

The object gratings and the image gratings may have effectively the same grating period, that is the grating period of the image gratings is equal to that of the object gratings multiplied by M, where M is the magnification factor of the main-lens system, for example 1/5 or 1/10. In that case the (0,+1) and (+1, 0) order sub-beams and the (0,−1) and (−1,0) order sub-beams are utilized for magnification-error detection.

However, suitably the device is characterized further in that the period of an object grating is equal to 2/M) times that of the associated image grating and in that the detectors are arranged in the path of the (+1,−1) and (0,+1) order sub-beams and in the path of the (−1,+1) and (0,−1) order sub-beams respectively. Irregularities in the grating structures or the fact that the width of the grating strips is not equal to that of the intermediate strips can then no longer affect the detector signals.

In order to obtain time-modulated detector signals the device in which the sub-beams of different diffraction orders are utilized may be characterized further by a drive means for periodically moving one of two associated image gratings and object gratings relative to each other.

However, preferably the magnification-error detection device utilizes other possibilities of time modulating the detector signals, so that moving an image grating or object grating to and fro is not necessary. The device is then characterized in that in the radiation path of each of the illumination beams a v. λ/2 plate is arranged in the zero-order sub-beam originating from the first grating, where v is an odd number and λ is the wavelength of the radiation used, for converting the state of polarization of this sub-beam into the orthogonal state relative to the state of polarisation of the first-order sub-beams originating from said grating.

In the most general case of two elliptically polarised beams orthogonal states of polarization are to be understood to mean that a. the azimuth of the polarization of one beam is rotated through 90° relative to that of the other beam, b. the ellipticities of the polarization are identical, and c. the sense of rotation of the polarization is opposite.

In the special case of two linearly polarized beams the orthogonality means that the directions of polarization extend perpendicularly to each other.

As a result of this, it becomes possible to obtain orthogonally polarized beams in the detection branches of the device, that is in those parts of the radiation paths which are traversed by the illumination beams after these beams have passed through a pair of associated gratings, which beams after further processing exhibit a phase difference which depends on the magnification error. Moreover, it is then also possible to detect a focussing error and an alignment error. An alignment error is an error in the alignment of two associated gratings relative to each other.

A first embodiment comprising v.λ/2 plates is characterized further in that for each illumination beam two λ/4 plates and a rotating polarisation analyser are arranged in the radiation path between the last grating traversed and the associated detectors. The rotating analyser generates periodic detector signals which exhibit phase differences which depend on a magnification error.

However, suitably the time modulation of the detector signals is obtained electronically. This is effected in a device which is characterized further in that each entrant illumination beam comprises two components having mutually perpendicular directions of polarisation and having different radiation frequencies, in that for each illumination beam there are provided four radiation-sensitive detectors, and in that polarisation-separating elements are arranged in the radiation path of the sub-beams between the last grating traversed and the detectors. In the detection branch the two frequencies of an illumination beam produce a signal having a beat frequency whose phase depends on a magnification error.

Another embodiment, in which the time modulation of the detector signals is obtained electronically, is characterized further in that each entrant illumination beam is a linearly polarised beam whose direction of polarisation varies periodically between two mutually perpendicular states, in that for each illumination beam there are provided four radiation-sensitive detectors, and in that polarization-separating elements are arranged in the radiation path of the sub-beams between the last grating traversed and the detectors.

In the foregoing it is assumed that the v.λ/2 plate is arranged in the radiation path between an image grating and an object grating. In practice, this may imply that this plate has to be arranged in the main lens system, which may complicate the design and manufacture of this lens system. This problem is precluded in an embodiment of the invention which is characterized further in that the grating period of an object grating is equal to k/M times the grating period of the associated image grating, where k is a number smaller than one, and in that in the detection branch for each illumination beam in each sub-beam which is diffracted in a first order by the last grating traversed there are arranged, in this order: the v.λ/2 plate, a lens which images the grating plane on an auxiliary grating between said lens and the detectors, and a polarization separating element between the auxiliary grating and the detectors.

The invention not only relates to a magnification-error detection device but also to an apparatus for the repeated imaging of a mask pattern onto a substrate comprising a mask table, a substrate table and a projection lens system interposed between said tables, in which apparatus the magnification-error detection device may be used advantageously. This apparatus is characterized further in that the main-lens system comprises the projection-lens system and in that the axial position of the mask table is adjustable relative to the projection-lens system and the substrate table by means of the magnification-error signal supplied by the magnification-error detection device.

Suitably, the apparatus is characterized further in that the radiation source for the magnification-error detection device is constituted by the radiation source employed for the repeated imaging of the mask pattern onto the substrate.

Figure 2:
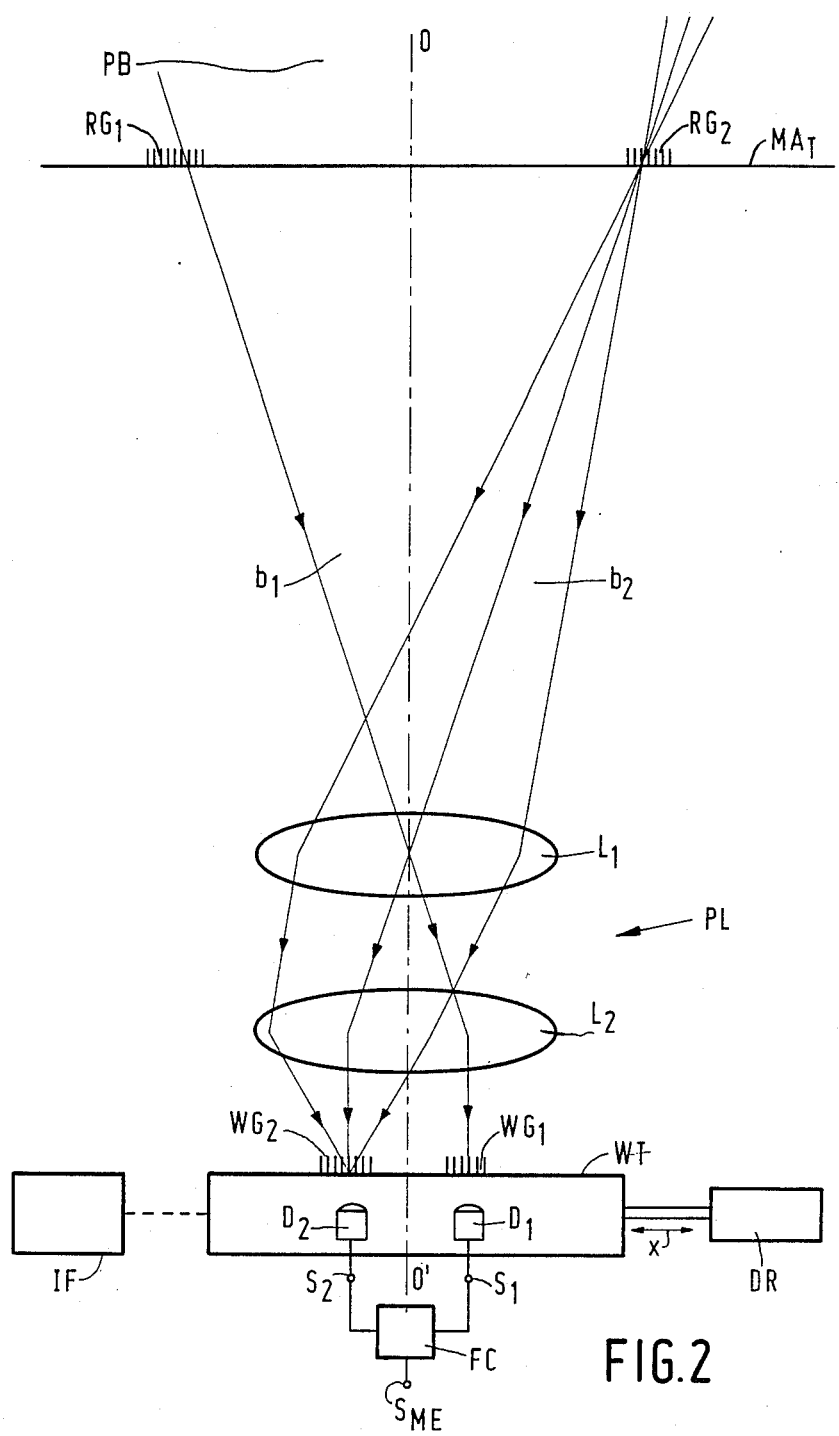
Figure 3A:
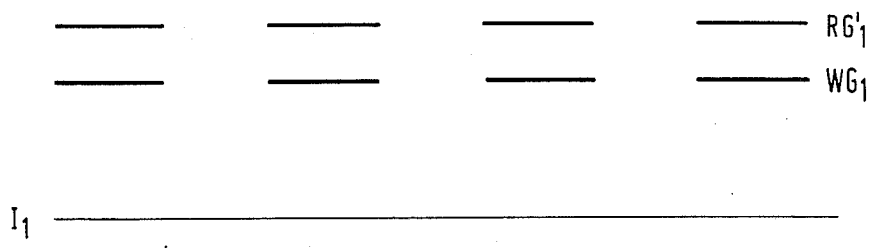
Figure 3A:
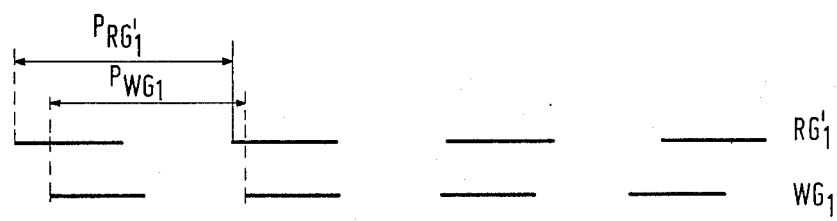
Figure 3B:
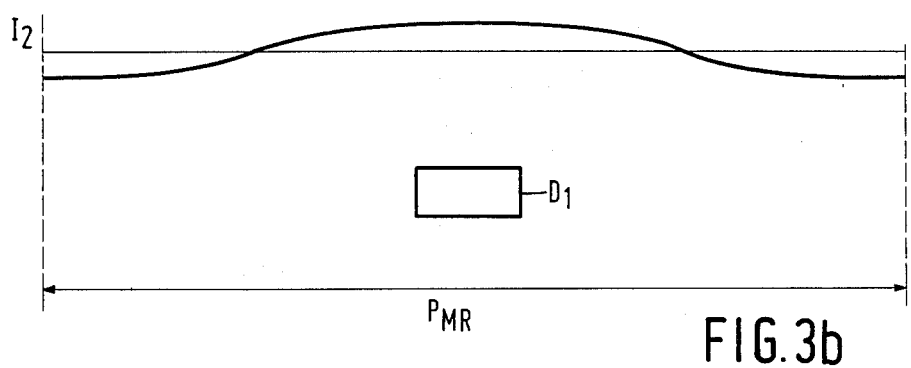
Figure 3C:
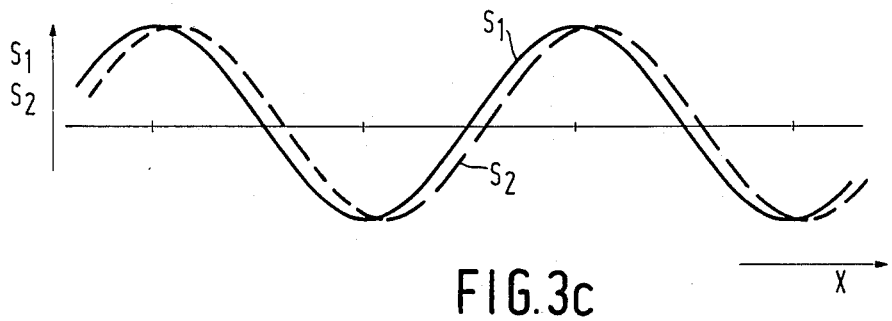
Figure 4:
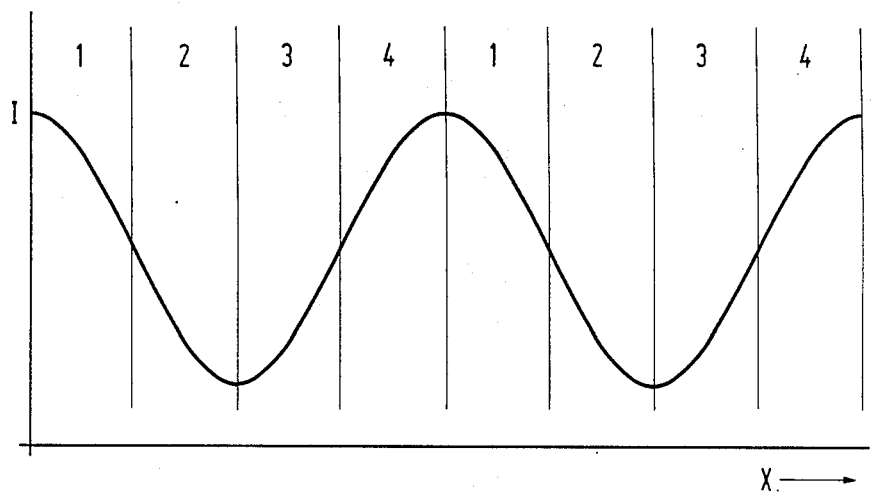
Figure 5:
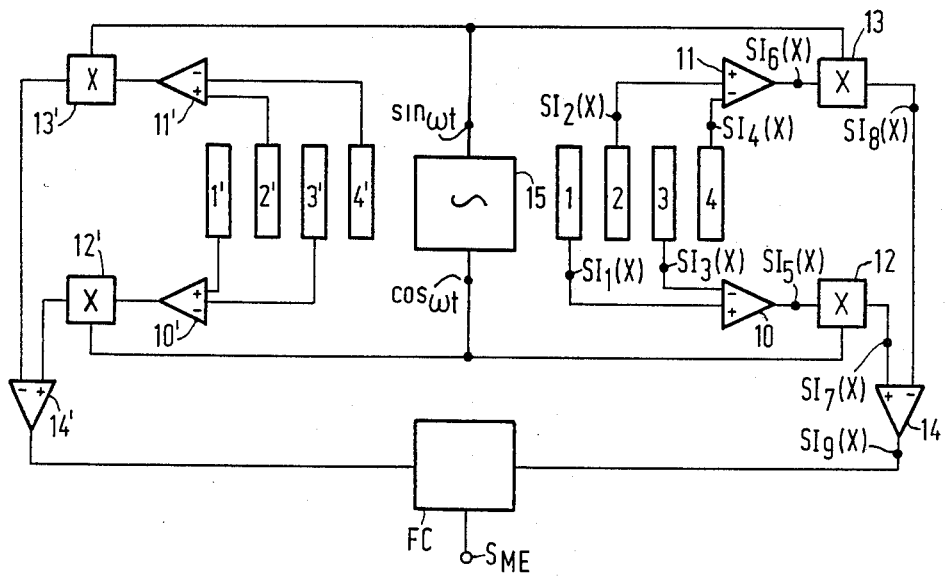
Figure 6:
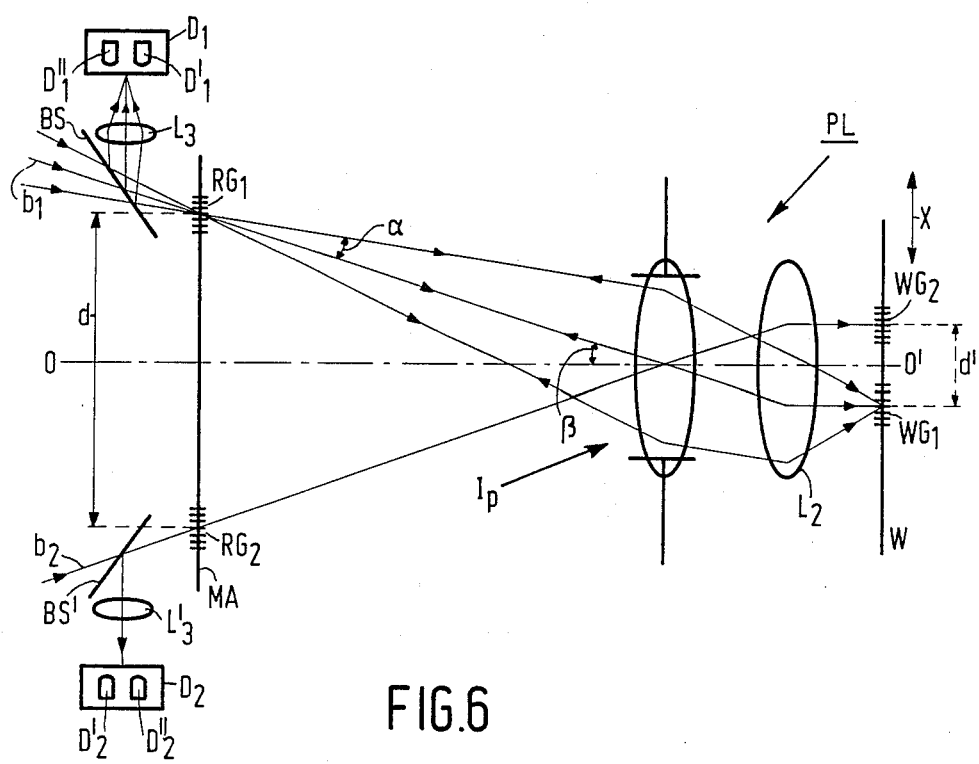
Figure 8:
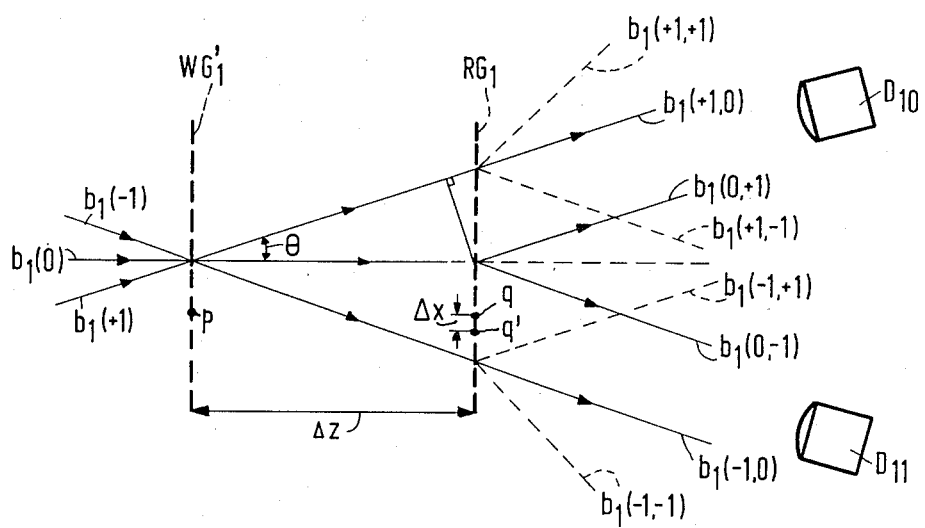
Figure 7A:
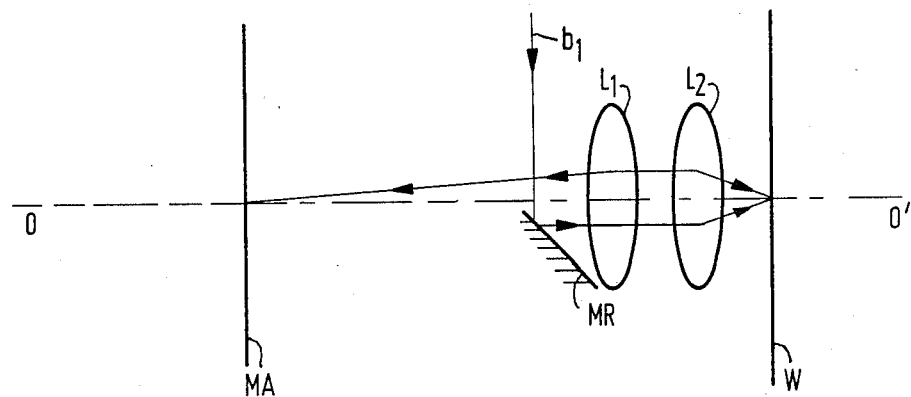
Figure 7B:
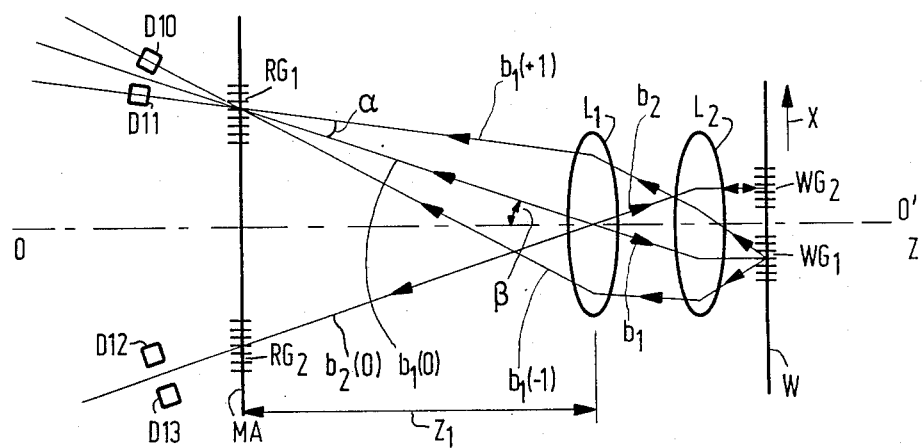
Figure 9A:
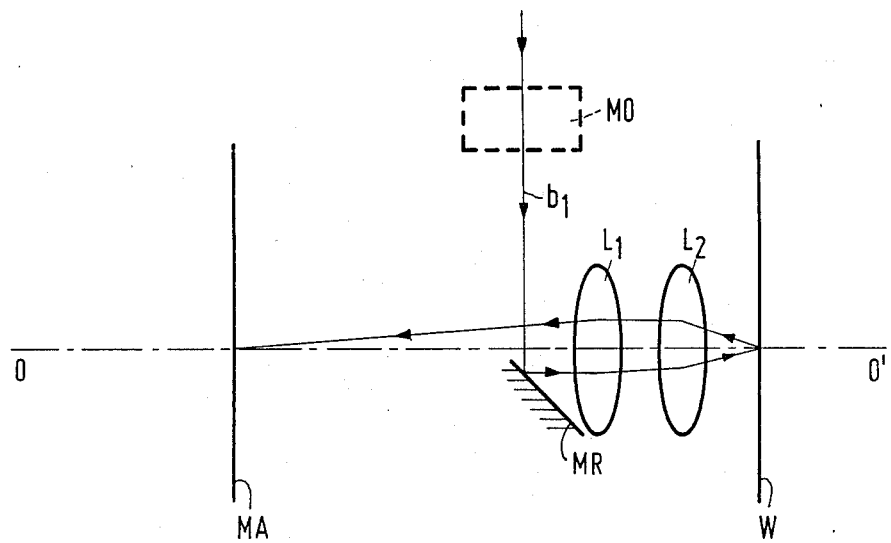
Figure 9B:
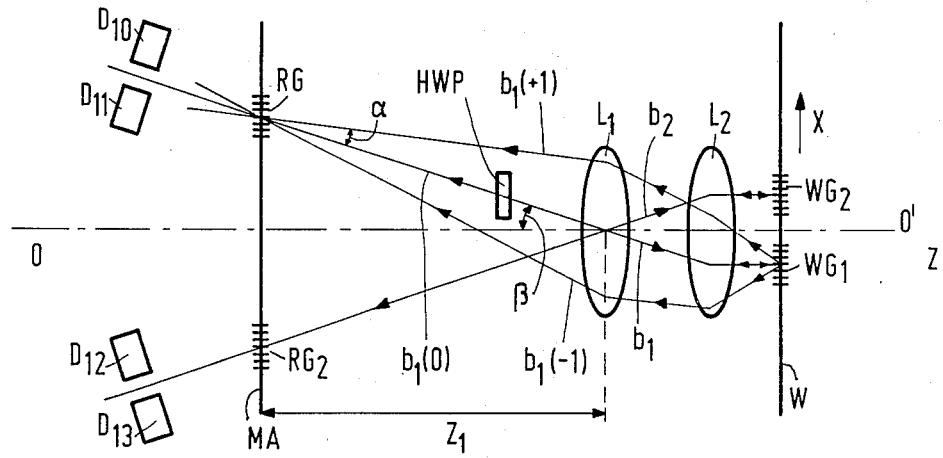
Figure 10:
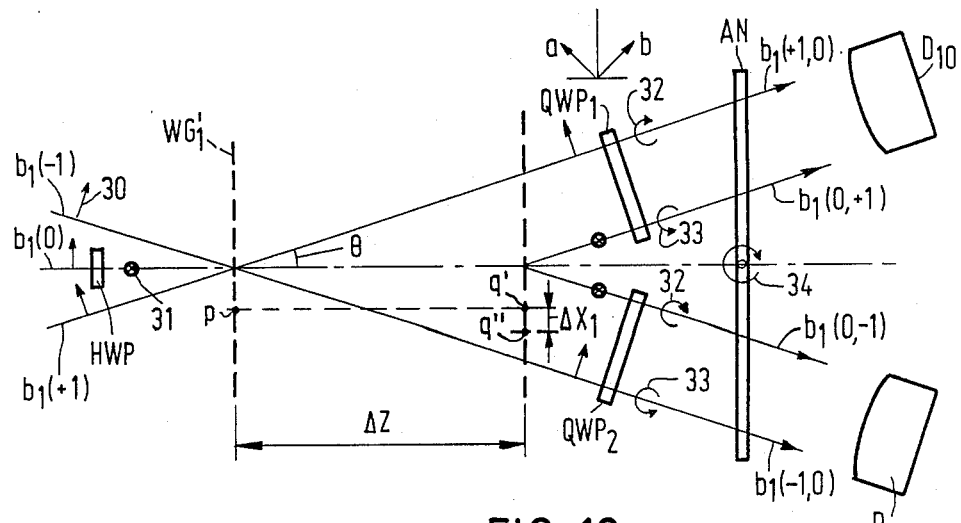
Figure 11:
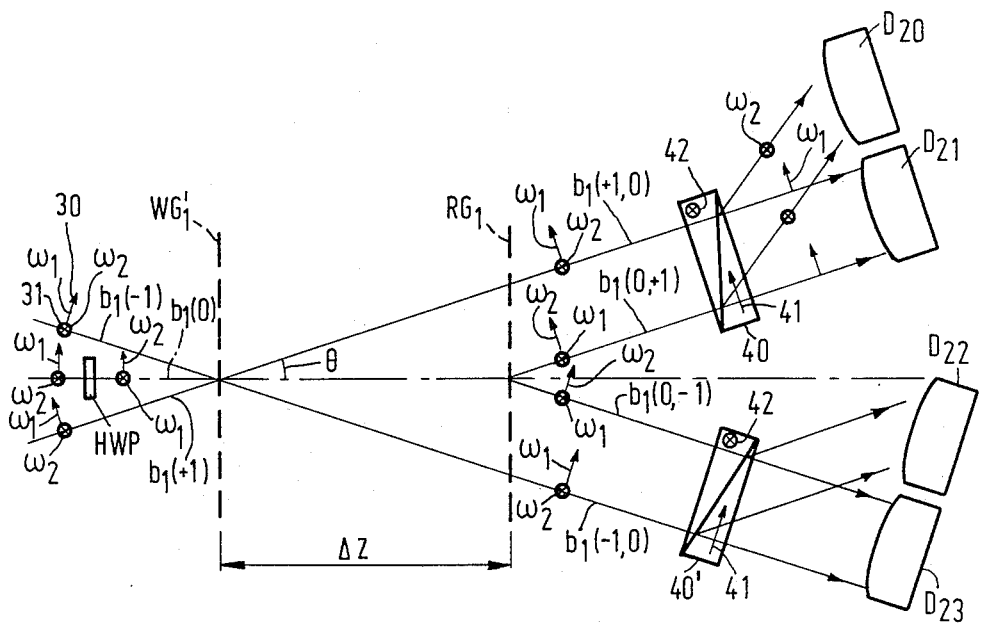
Figure 12:
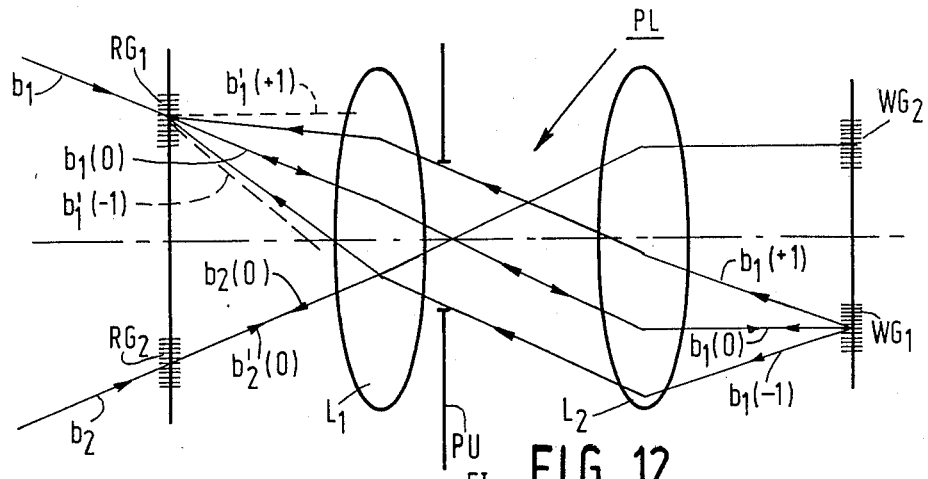
Figure 13:
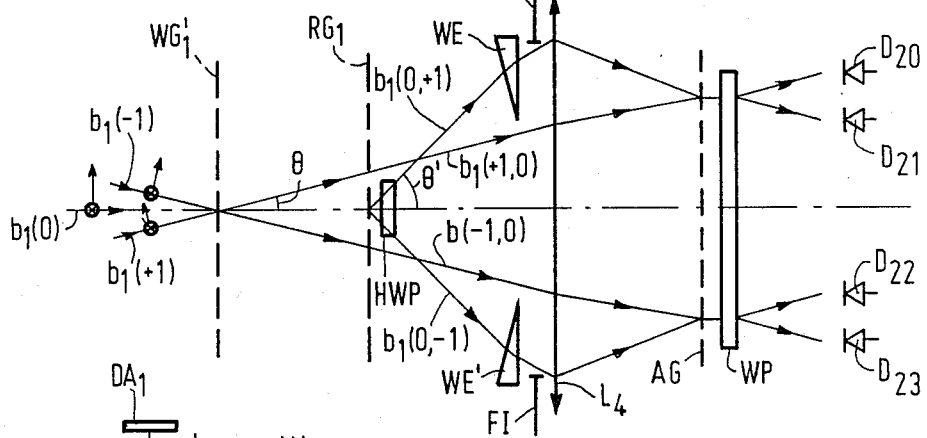
Figure 14:
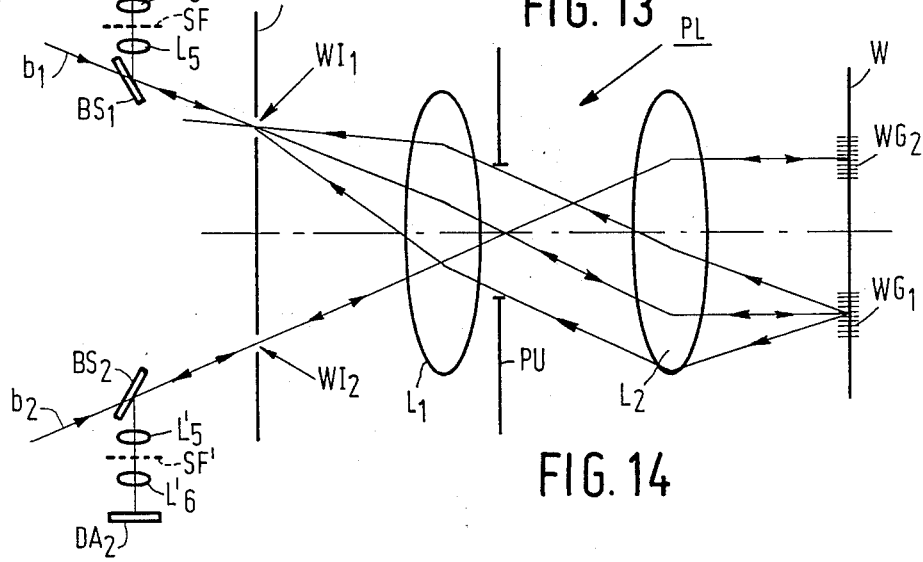

The invention will now be described in more detail, by way of example, by describing its use in an apparatus for the repeated imaging of a mask pattern onto a substrate. For this reference is made to the accompanying drawings. In the drawings:

FIG. 1 shows a known apparatus for the repeated imaging of a mask pattern onto a substrate, FIG. 2 shows a first embodiment of a device according to the invention for measuring magnification errors in said apparatus, FIGS. 3a, 3b and 3c illustrate the operation of this device, FIG. 4 shows a radiation-sensitive detection system which may be employed in this device and the intensity pattern of a grating image formed on this detection system, FIG. 5 shows an example of an electronic circuit for processing the detector signals from this detection system, FIG. 6 shows a second embodiment of a device according to the invention, FIGS. 7a and 7b respectively show a plan view and a side view of a first embodiment of a device utilizing narrow illumination beams, FIG. 8 shows a detection branch of this device, FIGS. 9a and 9b respectively show a plan view and a side view of a device using narrow beams having different directions of polarization, FIGS. 10 and 11 show a detection branch of a first and a second embodiment of the device, FIG. 12 shows a device in which the image gratings effectively have a different grating period than the object gratings, FIG. 13 shows a detection branch of this device, and FIG. 14 shows a device comprising an electronically simulated grating and operating with reflected radiation.

FIG. 1 shows a known apparatus for the repeated imaging of a mask pattern onto a substrate. The principal parts of this apparatus are a projection column, in which a mask pattern C to be imaged is mounted, and a movable substrate table WT, by means of which the substrate can be positioned relative to the mask pattern C.

The projection column incorporates an illumination system which may comprise a lamp LA, for example a mercury lamp, a mirror EM, an element IN, also referred to as an integrator, which ensures a homogeneous radiation distribution within the projection beam PB, and a condensor lens CO. The beam PB illuminates the mask pattern C present in the mask MA, which mask is arranged on a mask table MT.

The beam PB passing through the mask pattern C traverses a projection-lens system PL which is shown only schematically, which is arranged in the projection column, and which forms an image of the pattern C on the substrate W. The projection-lens system has a magnification of, for example, $M=1/10$, a numerical apertures $N.A.=0.42$, and a diffraction limited image field of a diameter of 23 mm.

The substrate W is arranged on a substrate table WT, which is supported, for example, on an air cushion. The projection-lens system PL and the substrate table WT are arranged in a housing HO, which is closed by a base plate BP, made of for example granite, at the bottom and by the mask table MT at the top.

For aligning the mask and the substrate relative to each other, as shown in FIG. 1, the mask MA comprises two alignment marks $M_1$ and $M_2$. Suitably, these marks comprise diffraction gratings, but alternatively they may comprise other marks such as squares or strips which differ optically from their environment. These alignment marks are two dimensional, that is they comprise sub-marks which extend in two mutually perpendicular directions, the X and the Y direction in FIG. 1. The substrate W, onto which the pattern C is to be imaged several times adjacent each other comprises a plurality of alignment marks, preferably also two dimensional diffraction gratings, of which two gratings $P_1$ and $P_2$ are shown in FIG. 1. The marks $P_1$ and $P_2$ are situated outside the areas on the substrate W where the images of the pattern C are to be formed. Suitably, the grating marks $P_1$ and $P_2$ are phase gratings and the grating marks $M_1$ and $M_2$ are amplitude gratings.

An apparatus as shown in FIG. 1, which is suitable for forming images on the substrate whose details or line widths are smaller than 1 μm, for example equal to 0.7 μm, comprises a projection lens system PL which is telecentric at the image side, that is the side of the substrate W, but which is non-telecentric at the object side, that is the side of the mask MA, so that magnification errors may arise during imaging if no further steps are taken. These magnification errors can be eliminated by moving the mask table MT in the direction of the optical axis of the projection-lens system relative to this system PL and the substrate table WT. For the desired highly accurate control of this displacement a signal, referred to as the magnification-error signal, must be generated which very accurately defines the magnitude of the deviation between the actual and the desired magnification and which also indicates the direction of this deviation.

In accordance with the invention it is possible to obtain this magnification-error signal when two gratings arranged at an accurately defined distance from each other in the mask and two gratings also arranged at an accurately defined distance from each other in the substrate itself or in the substrate table are imaged onto one another by means of the main lens system PL. The magnification-error measurement and, if necessary, the axial movement of the mask table relative to the lens system PL and the substrate table, are performed before the repeated imaging of the mask pattern C is started. How many times this measurement is to be performed will depend on the variations of the ambient parameters. If one day substantially no variations are anticipated, it may suffice to perform one measurement at the beginning of this day. In the case of more variations the magnification error may be measured, for example, when mounting each new mask pattern by means of which a large number of substrates is to be exposed. The magnification-error measurement may also be performed if it is envisaged that the substrates are subject to changes or if the substrate already exhibit structures formed by means of another exposure apparatus.

FIG. 2 shows a device in accordance with the invention in the simplest embodiment, which is preferably used if the construction of the exposure apparatus allows this. The object gratings comprise the gratings $RG_1$ and $RG_2$ in a test mask $MA_T$ and the image gratings comprise the gratings $WG_1$ and $WG_2$ in the substrate table WT. The gratings are represented by short vertical lines. In reality, the grating strips extend in a direction perpendicular to the plane of the drawing. The gratings are amplitude gratings or deep phase gratings which behave as amplitude gratings. The projection-lens system is represented schematically by two lenses $L_1$ and $L_2$; in reality, this lens system comprises a large number of lens elements. The optical axis OO' is indicated in broken lines.

The lens system PL images the grating $RG_1$ onto the grating $WG_1$ and the grating $RG_2$ onto the grating $WG_2$. For the beam $b_2$ which images $RG_2$ on $WG_2$ the two marginal rays in addition to the chief ray are shown, whilst for the beam $b_1$ which images $RG_1$ onto $WG_1$ only the chief ray is shown. These beams may form part of a single broad beam, which is suitably the same beam as the beam PB in FIG. 1, which subsequently images the mask pattern C onto the substrate. This is because the lens system PL is fully corrected for aberrations only for the specific wavelength, for example 365 nm, of the exposure beam PB. When another wavelength is used for magnification measurements minor deviations in the grating images may occur. However, in practice these deviations are so small that they may be considered to be constant. As a result of this, it is possible to correct for the shift of the zero point in the curve representing the magnification error signal, which shift is caused by said deviations.

A radiation-sensitive detection system $D_1$ and $D_2$ respectively is arranged in the path of each of the beams $b_1$ and $b_2$ passing through the gratings $WG_1$ and $WG_2$. In the present embodiment the detection systems comprise simple detectors. The detectors are arranged in the substrate table.

If the gratings $RG_1$ and $R_2$ are imaged on the gratings $WG_1$ and $WG_2$ with the correct magnification M, for example 1/10, the periods of the grating images $RG'_1$ and $RG'_2$ are equal to those of the gratings $WG_1$ and $WG_2$, as is indicated in FIG. 3. The detectors $D_1$ and $D_2$ then receive a specific amount of radiation which is the same for both detectors if the gratings are aligned correctly relative to one another. If a magnification error occurs the imaged grating $RG_1$ and the substrate grating $WG_1$ are no longer exactly in register with each other, as is shown in FIG. 3b. This gives rise to a moiré pattern, designated $I_2$, that is a pattern of light and dark areas which in practice gradually merge into one another and whose period $P_{MR}$ is substantially larger than the period $P_{RG'_1}$ and $P_{WG_1}$ of the gratings $RG'_1$ and $WG_1$. The magnitude of the period $P_{MR}$ is determined by the magnification error. If the magnification error is zero the period of the moiré pattern is infinite, as is indicated by the line $I_1$ in FIG. 3a.

In order to enable the magnification error to be determined the mask gratings and the substrate gratings are periodically moved relative to each other in the X-direction. For this purpose, as is shown schematically in FIG. 2, the substrate table WT may be coupled to a drive means DR for periodically moving this table in the X-direction. This drive means may comprise a drive means already present in the exposure apparatus for bringing the image of the gratings $P_1$ and $P_2$ in FIG. 1 in register with the gratings $M_1$ and $M_2$ to align the mask and the substrate relative to one another. The alignment device of the exposure apparatus cooperates with an interferometer system designated IF in FIG. 1. This interferometer system may also be used for controlling the periodic movement of the substrate table for the purpose of magnification-error measurement.

Owing to the periodic movement of the substrate grating $WG_1$ relative to the imaged mask grating $RG_1$ the amount of radiation incident on the detector $D_1$ and consequently the signal $S_1$ supplied by this detector will vary periodically. In the case of sufficiently small grating periods $P_{RG1}$ and $P_{WG1}$ the detector signal $S_1$ as a function of the position X of the substrate table WT is substantially sinusoidal, as is shown in FIG. 3c. The detector $D_2$ also supplies a periodic signal $S_2$ having the same waveform as the signal $S_1$. In the event of a magnification error and, consequently, a moiré pattern of finite period, a phase difference $\Delta\phi$ occurs between teh signals $S_1$ and $S_2$. The signals are applied to a phase comparator circuit FC whose output signal constitutes the magnification-error signal $S_{ME}$. This signal is utilized for correcting the axial position of the substrate table in such a way that the signals $S_1$ and $S_2$ are substantially in phase. The period of the moiré pattern is then infinite and the magnification error is reduced to substantially zero.

The phase comparator circuit may be constructed in a way similar to that used for measuring linear displacements of an object by means of gratings, as is described in the article: "Accurate digital measurement of displacements by optical means" in "Philips' Technical Review" 30, 1969, No. 6/7, pages 149–160. As set forth in said article, a comparison of the phases of the beams originating from gratings which are imaged onto one another enable displacements of said gratings relative to each other to be determined very accurately and independently of variations in the measurement system.

If a phase difference $\Delta\phi = \epsilon$ between $S_1$ and $S_2$ can still be measured accurately by electronic means and if the residual magnification error after correction of the magnification gives rise to a positional error not greater than 0.05 μm at the edge of the substrate area within which the mask pattern is to be imaged repeatedly, the following relationship is valid $$\frac{\epsilon}{2\pi} P_{WG1} \leq 2 \cdot 0.05 \, \mu m$$

The factor 2 in the right-hand part of this equation results from the fact that said positional errors have opposite signs for the two substrate gratings. If $P_{WG1} = 2$ μm the phase difference will be $\epsilon \leq 0.31$ rad. The minimum phase difference which should be detectable is then approximately 18°, which corresponds to approximately 1/20 of the period of the signals $S_1$ and $S_2$. This fairly large phase difference can already be detected by means of gratings which extend over a length corresponding to only a few times the grating period. The stroke of the periodic substrate-table movement may then be limited to some tens of $\mu m$. When longer gratings are used it is possible to detect even smaller phase errors.

The desired time modulation of the detector signal can be obtained by a periodic movement of the substrate gratings relative to the mask grating, but it can also be obtained by replacing each of the substrate gratings and the associated detector by an array of radiation sensitive detectors in the form of photodiodes. The detector array may be arranged in such a way that in one period of the grating image $RG'_1$, which image is again assumed to be sinusoidal on account of the fine detail of the grating structure, there are for example four photodiodes, as is shown in FIG. 4. The first four detectors bear the reference numerals 1, 2, 3 and 4 and form a first group. This group is followed by a second group and further groups of detectors. For the sake of simplicity only two groups of detectors are shown in FIG. 4. The detectors of the first group are interconnected to the corresponding detectors of the second group and those of the next groups. Corresponding detectors of the groups bear the same reference numerals.

Since four detectors fit exactly in one period of the intensity profile of an imaged grating, the phase difference between the signals from two successive detectors is $\pi/2$ rad. Therefore, the detector signals may be represented by:

$$SI_1(x) = I. \cos(x+\phi_1) + I_1$$

$$SI_2(x) = I. \sin(x+\phi_1) + I_2$$

$$SI_3(x) = -I. \cos(x+\phi_1) + I_3$$

$$SI_4(x) = -I. \sin(x+\phi_1) + I_4$$

where the phase term $\phi_1$ is caused by a shift of the image of a mask pattern relative to the detectors resulting from a magnification error, and $I_1 \ldots I_4$ are direct current terms which, in principle are equal.

FIG. 5 schematically represents the electronic processing of the signals from the detector arrays associated with the grating picture $RG'_1$ and $RG'_2$. Each of these arrays is represented by only four detectors, so that the output signal of the detector represents the sum of the output signals of a plurality of detectors corresponding to the number of groups. The signals $SI_1(x)$ and $SI_3(x)$ are applied to a differential amplifier 10 and the signals $SI_2(x)$ and $SI_4(x)$ are applied to a differential amplifier 11, resulting in:

$$SI_5(x) = SI_1(x) - SI_3(x) = 2.I. \cos(x+\phi_1)$$

$$SI_6(x) = SI_2(x) - SI_4(x) = 2.I. \sin(x+\phi_1)$$

By means of multipliers 12 and 13 these signals are multiplied by the signal $\cos \omega t$ and $\sin \omega t$, respectively, supplied by an oscillator 15. These multipliers then deliver the signals:

$$SI_7(x) = 2.I. \cos(x+\phi_1). \cos \omega t$$

$$SI_8(x) = 2.I. \sin(x+\phi_1) \sin \omega t$$

which are applied to the inputs of a differential amplifier 14, whose output signal is:

$$SI_9(x) = 2.I. \cos(x+\phi_1+\omega t)$$

The signals from the detectors 1', 2', 3' and 4' representing the detector array associated with the grating image $R'_2$ are processed in the similar way by means of the elements 10', 11', 12', 13', 14' and 15, resulting in a signal $SI'_9(x) = 2.I. \cos(x+\phi_2+\omega t)$.

In the phase comparator circuit FC the phases $\phi_1$ and $\phi_2$ of the signals $SI_9(x)$ and $SI'_9(x)$ are compared with each other, yielding a magnification-error signal $S_{ME}$.

In the embodiment shown in FIG. 2 each of the detectors $D_1$ and $D_2$ may be replaced by two detectors. The purpose of this will be explained with reference to FIG. 6, which shows an embodiment which also utilizes this step.

If it is not desired or not possible to arrange detectors in the substrate table, the magnification-error measurement should be effected by means of reflected radiation instead of transmitted radiation. The embodiments of the invention to be described hereinafter all operate with reflected radiation.

The image gratings may be formed by gratings on the substrate table. On such a table it is always possible to arrange these small gratings outside the substrate. However, alternatively, the image gratings may be arranged on the substrate itself. This is preferred if it is anticipated that, for example, deformations of the substrate will occur or if it is desired to have the possibility of using different exposure apparatuses in the processing of a substrate.

FIG. 6 shows a first embodiment of a magnification-error detection device employing a reflected radiation. Again two gratings $RG_1$ and $RG_2$ are arranged on the mask MA at an accurately defined distance $d$ from each other and two gratings $WG_1$ and $WG_2$ are provided in the substrate w at a distance $d'$, which is exactly equal to $d$ times the magnification M, for example 1/10, of the projection-lens system PL. The gratings $RG_1$ and $RG_2$ are amplitude gratings and, suitably, the gratings $WG_1$ and $WG_2$ are also amplitude gratings. The last-mentioned gratings may also be phase gratings. However, in that case steps have to be taken to image the phase gratings as amplitude gratings. For this purpose, as is described in European Patent Application No. 0,164,165, polarization means and beam-splitting means may be employed which ensure that two sub-beams which are shifted relative to one another by half a grating period are incident on a phase grating and that the beams reflected by the phase grating are recombined.

If the grating period of the phase gratings is small enough these gratings cause diffractions at such large angles that a substantial portion of the radiation falls outside the projection lens system. In that case phase gratings may be used for magnification-error measurement of the substrate without a conversion of the phase gratings to amplitude gratings.

As is shown in FIG. 6 an illumination beam $b_1$ having a small aperture angle $\alpha$ traverses the mask gratings $RG_1$. Suitably, this beam is aimed at the centre of the entrance pupil IP of the projection lens system PL, because this minimizes aberrations caused by this system. The beam $b_1$ traverses the projection-lens system PL and is incident on the substrate grating $WG_1$. A part of the radiation of the beam $b_1$ is reflected, traverses the projection lens system again, and is incident on the grating $RG_1$. A part of the radiation transmitted by this grating is directed to the detection system $S_1$ by a beam splitter BS, for example a semitransparent mirror. The auxiliary lens $L_3$ ensures that the grating $RG_1$ is imaged on the radiation-sensitive surface of this detection system. By means of a second radiation beam $b_2$, of which only the chief ray is shown for the sake of simplicity, the substrate grating $WG_2$ is imaged on the mask grating $RG_2$. A part of the radiation transmitted by this grating is received by a detection system $D_2$.

This device operates in a way similar to that shown in FIG. 2; as a result of the periodic movement of the substrate in the X-direction periodic detector signals are generated and by phase comparison of these signals it is ascertained whether a moiré pattern having a non-infinite period occurs. Subsequently, the magnification is adapted by moving the mask MA relative to the projection-lens system and relative to the substrate along the optical axis OO' of this system until the detector signals are in phase.

Preferably, the illumination beams $b_1$ and $b_2$ have the same wavelength as the projection beam PB in FIG. 1. The beams $b_1$ and $b_2$ may be portions of the projection beam. Since the aperture angle $\alpha$ of the beams $b_1$ and $b_2$ is small relative to the field angle or angle of view $\beta$ of the projection-lens system, the detection systems $D_1$ and $D_2$ can be screened effectively from radiation reflected from the front of the mask when a diaphragm with a narrow aperture is arranged in the radiation path behind the two gratings. Such a diaphragm may be formed by the beam-splitting mirror BS if the reflecting surface of this mirror is small.

When an imaged substrate mask is shifted relative to a mask grating as a result of a magnification error over a distance equal to the period of a mask grating this corresponds to a phase shift of $2\pi$ rad in a detector signal. If it is required that, after detection and correction, the resulting magnification error is allowed to give rise to a maximum displacement of 0.05 $\mu$m of a line imaged on the substrate and if the phase difference between the detector signals which can still be detected accurately is $\epsilon$ rad, the following requirement should be met:

$$\frac{\epsilon}{2\pi} P_R \leq 2 \cdot 10 \cdot 0.05 \ \mu m \text{ for magnification } M = 1/10.$$

Consequently, in the case of a grating period $P_R = 20$ $\mu$m, it is required that:

$$\epsilon \leq 0.31 \text{ rad.}$$

This corresponds to 18° or 1/20 period of the detector signals. Such a phase difference can still be measured correctly by electronic means when gratings are used having a length corresponding to some grating periods. The displacement of the substrate grating in the X-direction may be limited to this number of periods of the substrate gratings, that is to some tens of $\mu$m.

In principle, the radiation-sensitive detection systems $D_1$ and $D_2$ may each comprise one detector. However, suitably these systems each comprise two detectors $D'_1$, $D''_1$ and $D'_2$, $D''_2$. By phase comparison of the signals from the detectors $D'_1$ and $D''_1$ it is possible to determine whether the parts of the mask grating observed by these detectors and the substrate gratings imaged thereon coincide exactly. However, if this is the case it is still possible that the gratings are displaced by a full grating period relative to one another. However, in the case of, for example, a centre-to-centre distance of 60 mm between the gratings $RG_1$ and $RG_2$ and a distance of 5 mm between the detectors $D'_1$ and $D''_1$ such a displacement results in a phase difference between the signals from the detectors $D'_1$ and $D''_1$, which phase difference corresponds to 1/12 of the period of the signals of the detectors $D'_1$ and $D''_1$ and can be measured even more simply than the above-mentioned phase difference of 1/20 period. Thus, said displacement by a full grating period can be detected by phase comparison of the signals from the detectors $D'_1$ and $D''_1$ or from the detectors $D'_2$ and $D''_2$.

An axial-position error of the mask larger than the depth of focus of the lens system $L_1 L_2$ causes a deviation of the d.c. level of the detector signal and a deviation in the modulation depth of these signals. One of these parameters may be utilized for detecting a focussing error larger than the depth of focus. A focussing error can be eliminated by moving the substrate in an axial direction relative to the projection-lens system. The magnification-error measurement by means of the device shown in FIG. 6 is not affected by a focussing error.

As is known, a radiation beam which is incident on a grating will be split into a plurality of sub-beams of different diffraction orders by this grating, namely into a non-diffracted zero-order sub-beam, two first-order sub-beams which are diffracted at a specific angle determined by the grating period, two second-order sub-beams which are diffracted through twice this angle, and higher-order sub-beams. If, as is assumed in the description with reference to FIGS. 2 and 6, the beams $b_1$ and $b_2$ have an aperture angle $\alpha$ which is large relative to the angle at which the sub-beams are diffracted, the sub-beams of the various diffraction orders will overlap each other and the sub-beams cannot be detected separately. However, in the embodiments to be described hereinafter the gratings are illuminated by beams which have a substantially smaller aperture angle, for example ten times as small. In that case the sub-beams can be detected separately, so that it is possible to generate a focussing-error signal in addition to a magnification-error signal. Moreover, it is then possible to employ different methods for generating time-modulated detector signals.

FIGS. 7a and 7b respectively show a plan view and a side view of a device utilizing this possibility. In this device the illumination beams $b_1$ and $b_2$ can no longer enter the imaging systems by the mask gratings $RG_1$ and $RG_2$, because the first passage through these gratings would also give rise to diffraction orders, so that after diffraction by the substrate gratings $WG_1$ and $WG_2$ and further diffraction caused by the secondpassage through the mask gratings so many different diffraction orders would occur that these could not longer be detected separately. For this reason the beams $b_1$ and $b_2$ enter the imaging system by a mirror MR, as is shown in FIG. 7a. This Figure only illustrates how the beam $b_1$ enters. The beam $b_2$ which is situated before or behind the plane of the drawing of FIG. 7a enters by the same mirror MR.

As is shown in FIG. 7b, the beam $b_1$ traverses the projection-lens system $L_1, L_2$ and the chief ray of this beam is perpendicularly incident on the substrate grating $WG_1$. The beam reflected by this grating is split into a zero-order sub-beam $b_1(0)$ and two first-order sub-beams $b_1(+1)$ and $b_1(-1)$. The beams of higher diffraction orders may be ignored because their intensity is low, or they fall largely outside the pupil of the projection lens system, or they can be filtered out after passage through this lens system. The radiation reflected by the grating $WG_1$ again traverses the lens system and reaches the mask grating $RG_1$. This grating splits the zero-order and first-order sub-beams each into a zero-order sub-beam and two first-order sub-beams. These sub-beams are shown in FIG. 8. In this Figure $WG_1'$ is the image of the grating $WG_1$. It may occur that the plane in which this grating is imaged does not coincide with the plane of the mask grating: then a focussing error $\Delta Z$ occurs. Of the large number of sub-beams produced during passage through the mask grating $RG_1$ only four sub-beams are employed which are incident in pairs on one of the detectors $D_{10}$ and $D_{11}$. As is shown in FIG. 8, it is possible to ensure by means of suitable filters or a suitable arrangement of the detectors that the detector $D_{10}$ is hit by, for example, the sub-beams $b_1(+1,0)$ and $b_1(0,+1)$ and the detector $D_{11}$ by the sub-beams $b_1(-1,0)$ and $b_1(0,-1)$.

When a focussing error $\Delta Z$ occurs there will be phase difference $\Delta \phi$ between the sub-beams $b_1(0)$ and $b_1(+1)$ or $b_1(-1)$ as a result of the difference in the optical pathlengths traversed by these beams between the gratings $WG'_1$ and $RG_1$. In the case of a pathlength difference $\Delta W$ this phase difference is:

$$\Delta \phi = 2\pi \frac{\Delta W}{\lambda}$$

It follows from FIG. 8 that $$\Delta W = \Delta Z (1 - \cos \theta)$$

For small angles $\theta$ the following applies:

$$\Delta W = \Delta Z \cdot \frac{\theta^2}{2}$$

In the case of a periodic displacement of the imaged grating in the X-direction the signals from the detectors are moreover modulated with a time frequency $$\omega = \frac{2\pi X'}{P_{WG'1}}$$

where $X'$ is the velocity in the X-direction and $P_{WG'1}$ is the grating period of the image grating $WG'_1$.

A magnification error produces an additional phase difference between the signals from the detectors $D_{10}$ and $D_{11}$.

The a.c. signals supplied by the detectors $D_{10}$ and $D_{11}$ may be represented as $$SI_{10} = \cos(\omega t + \gamma F + \gamma M)$$

$$SI_{11} = \cos(\omega t - \gamma F + \gamma M)$$

FIG. 8 relates to the image of the grating $WG_1$ formed on the grating $RG_1$ by the beam $b_1$. It will be evident that a similar Figure applies to the imaging of the grating $WG_2$ onto the grating $RG_2$ by means of the beam $b_2$. If the latter figure detectors $D_{12}$ and $D_{13}$ are arranged at the locations of the detectors $D_{10}$ and $D_{11}$ in FIG. 8, the signals from the detectors $D_{12}$ and $D_{13}$ comply with:

$$SI_{12} = \cos(\omega t + \gamma F - \gamma M)$$

$$SI_{13} = \cos(\omega t - \gamma F - \gamma M)$$

In this expression $$\omega = \frac{2\pi X'}{P_{WG'1}}$$

The phase term $\gamma F$ as a result of the focussing error is given by $$\gamma F = \tfrac{1}{2}\Delta \phi = \frac{\pi \cdot \Delta Z}{\lambda} \theta^2$$

The grating diffraction angle $\theta$ complies with $$\sin \theta = \frac{\lambda}{P_{RG}},$$

i.e. for small angles $\theta$ this angle is $$\theta = \frac{\lambda}{P_{RG}}$$

and, consequently, $$\gamma F = \pi \cdot \Delta Z \cdot \frac{\lambda}{P_{RG}}$$

The depth of focus s of the projection lens system PL complies with:

$$S = \frac{\lambda}{\pi \cdot NA^2}$$

where NA is the numerical aperture of the lens system or $\sin \beta$, cf. FIG. 7b. If the angles $\beta$ are small and if $\theta = C.\beta$, where C is a constant smaller than 1, this yields $$S = \frac{\lambda}{\pi} \cdot \frac{C^2}{\theta^2}, \text{ hence}$$

$$F = \frac{\Delta Z}{S} C^2$$

A focussing error equal to one time the depth of focus s results in a phase difference $2 \gamma F = 2$ rad between the signals $SI_{10}$ and $SI_{11}$ and between the signals $SI_{12}$ and $SI_{13}$ if $C=1$. This means that focussing errors smaller than the depth of focus of the projection-lens system can be detected.

Since the signals $SI_{10}$ and $SI_{11}$ differ only from one another with respect to the phase term $\gamma F$ a phase comparison of these signals in a phase comparator circuit enables the magnitude and the direction of a focussing error to be detected.

The phase term $\gamma M$ is determined by the magnification error. If $\Delta X$ is the distance, which depends on the magnification error, between the actual position q and the desired position q' in the plane of the mask of the image of a point p on the substrate, the phase difference $2 \gamma M$ between the signals $SI_{10}$ and $SI_{12}$ or between the signals $SI_{11}$ and $SI_{13}$ is equal to:

$$2 \cdot \gamma M = 4 \cdot \pi \frac{\Delta x}{P_{RG}}$$

where $P_{RG}$ is the period of the mask gratings. If an X of 0.5 μm is permissible and if $P_{RG}=20$ μm it should be possible to detect a phase difference between the detector signals of $$2 \cdot \gamma M = 4\pi \frac{0.5}{20} = 0.31 \text{ rad,}$$

which corresponds to 1/20 of the period of the signals $SI_{10}$ and $SI_{12}$, which presents no problem. The magnification error can be detected by phase comparison of the signals $SI_{10}$ and $SI_{12}$ or the signals $SI_{11}$ and $SI_{13}$ in a phase-comparator circuit.

A displacement of the mask in the Z-direction over a distance $\Delta Z$ gives rise to a displacement of the grating images in the X-direction of $\Delta X = \tan \beta \cdot \Delta Z$.

Since $\tan \beta = d_1/Z$, in which $d_1$ is the distance between the centres of the mask gratings, see FIG. 6, and Z is the distance between the plane of the pupil and the plane of the mask, see FIG. 7b, this yields:

$$\Delta X = \frac{d_1}{Z_1} \cdot \Delta Z$$

In the case of a distance $d_1 = 65$ mm and $Z_1$ is 384 mm a displacement $\Delta Z = 1$ μm results in a displacement of 0.17 μm of the imaged gratings the mask plane. In view of the large depth of focus $$\left( s = \frac{\lambda}{2NA^2} \right)$$

of the projection lens system, for example 200 μm for an NA=0.32 and λ=0.4 μm, such a focussing error is negligible. In this projection system the magnification is more critical than the focussing.

In the foregoing it is assumed that the mask gratings have a grating period equal to 1/M times the grating period of the substrate gratings. The mask gratings may also have a period which is twice as large, i.e. a period equal to 2/M times the period of the substrate gratings. The detector $D_{10}$ or $D_{11}$ is then arranged in such a way that it is hit by the sub-beams $b_1(+1,-1)$ and $b_1(0,+1)$ and the sub-beams $b_1(-1,+1)$ and $b_1(0,-1)$ respectively. The advantage of this is that second-order sub-beams which may be produced by the mask grating if the width of the grating strips of these gratings is not equal to that of the intermediate strips, or which may be produced as a result of deformations of these gratings, can no longer overlap with the zero-order sub-beam and the first-order sub-beams at the location of the detectors. Such overlaps may give rise to a slight distortion of the detector signals.

Instead of by a periodic movement of the substrate or the mask the time modulation of the detector signals can also be obtained by using sub-beams which are polarised perpendicularly to each other and means for modulating the phase between these beams. Modulation may be effected at the detector side, that is in the detection branch, or at the object side. FIG. 9a is a plan view and FIG. 9b a side view of a device operating with polarised sub-beams. These Figures differ from FIGS. 7a and 7b only in that λ/2 plates HWP are arranged in the radiation path between the substrate gratings $WG_1$, $WG_2$ and the mask gratings $RG_1$, $RG_2$, λ being the wavelength of the radiation which is used.

The operation of the device employing polarized beams is best illustrated by means of FIG. 10 which shows an imaged substrate grating $WG'_1$ and the associated mask grating $RG_1$, as well as the sub-beams formed by these gratings. The sub-beams $b_1(0)$, $b_1(+1)$ and $b_1(-1)$ originating from the substrate grating are linearly polarised beams whose direction of polarisation, indicated by the arrow 30, is situated in the plane of the drawing. A λ/2 plate HWP is arranged in the path of the zero-order beam $b_1(0)$ to rotate the direction of polarisation of this beam through 90° in the direction indicated by the arrow 31 which extends perpendicularly to the plane of the drawing. As a result of this, the sub-beams $b_1(+1,0)$ and $b_1(0,+1)$ are also polarised perpendicularly to each other, which is also the case with the sub-beams $b_1(-1,0)$ and $b_1(0,-1)$. In the path of each pair of sub-beams which are polarised perpendicularly to each other a λ/4 plate QWP is arranged in a diagonal position. "Diagonal position" is to be understood to mean that the optic axis of this plane extends at an angle of +45° or −45° to the directions of polarisation 30 and 31. The directions of the optic axes of the plates $QWP_1$ and $QWP_2$ are indicated by the arrows a and b in FIG. 10. For the sake of simplicity these arrows are shown in the plane of the drawing; in reality these arrows extend at angles of +45° and −45° to the plane of the drawing. The λ/4 plate $QWP_1$ converts the beam $b_1(+1,0)$ into a clockwise circularly polarised beam and the beam $b_1(0,+1)$ into a counter clockwise circularly polarised beam, as is indicated by the arrows 32 and 33. The λ/4 plate $QWP_2$ performs the same function for the beams $b_1(-1,0)$ and $b_1(0,-1)$. As in reality the two sub-beams $b_1(+1,0)$ and $b_1(0,+1)$ and the sub-beams $b_1(-1,0)$ and $b_1(0,-1)$ practically coincide, these two oppositely circularly polarised sub-beams form one linearly polarised sub-beam whose azimuth or polarisation is determined by the phase difference between these beams. Before the linearly polarised sub-beams reach their respective detectors $D_{10}$ and $D_{11}$ they traverse a polarization analyser AN which rotates with an angular velocity $\Omega t$, thereby causing the detector signals to be time-modulated. The rotation of the analyser is indicated by the arrow 34, which has the same direction as the arrow 32. The signals from the detectors may now be represented by:

$SI_{10} = \cos(Qt - \gamma F + \gamma M, 1)$ $SI_{11} = \cos(Qt - \gamma F + \gamma M, 1)$ FIG. 10 relates to the image of the grating $WG_1$ formed on the grating $RG_1$ by means of the beam $b_1$. It will be obvious that a similar Figure applies to the image of the grating $WG_2$ formed on the grating $RG_2$ by means of the beam $b_2$. If in the last-mentioned Figure detectors $D_{12}$ and $D_{13}$ are arranged at locations analogous to the locations of the detectors $D_{10}$ and $D_{11}$ in FIG. 10, the signals from the first-mentioned detectors comply with:

$SI_{12} = \cos(QT + \gamma F - \gamma M, 2)$ $SI_{13} = \cos(QT - \gamma F - \gamma M, 2)$ In this expression for the detector signals $$2\gamma F = \frac{2\pi \Delta X}{\lambda} \theta^2$$

is again the phase difference as a result of a focussing error $\Delta Z$, which can again be detected by phase comparison of, for example, the signals $SI_{10}$ and $SI_{11}$ and which can be eliminated by moving the substrate in the axial direction relative to the projection-lens system.

The phase term $\gamma M,1$ is caused by a deviation $\Delta X_1$ between the actual position q' and the desired position q of the image of a point P of the substrate grating on the mask grating $RG_1$. The phase term $\gamma M,2$ is caused by a similar deviation $\Delta X_2$ at the location of the grating $RG_2$. Said deviation may be caused by an alignment error of a mask grating relative to the associated substrate grating or by a magnification error. The magnification error can be detected by comparing the phase term $\gamma M,1$ with the phase term $\gamma M,2$. The magnification error can be eliminated by applying the magnification-error signal thus obtained to a servo system by means of which the mask can be moved in the axial direction relative to the projection lens system and relative to the substrate.

After the magnification error has been eliminated and hence $\gamma M,1 = \gamma M,2 = \gamma M,0$ the alignment error can be detected by comparing the value of $\gamma M,0$ with a reference value, which is for example given by the position of the analyser AN. The alignment error can be eliminated by moving the substrate in the X-direction relative to the mask. When two-dimensional gratings are used and additional detectors it is also possible to detect and eliminate an alignment error in the Y-direction perpendicular to and in the same plane as the X-direction.

Instead of by means of a rotating polariser in the detection branch the time modulation of the detector signals is preferably effected by utilising incoming beams $b_1$ and $b_2$ which comprise two components which are polarized perpendicularly relative to each other and which have different frequencies or time-varying phases. A first possibility to achieve this is the use of a Zeeman laser as described in the article "Displacement measurement with a laser interferometer" in "Philips' Technical Review", Vol. 30, No. 6–7, pages 160–166. Such a laser produces a beam comprising two oppositely circularly polarized beam components having different radiation frequencies $\omega_1$ and $\omega_2$. In the detection branch a beat frequency $\Delta\omega = \omega_1 - \omega_2$ is produced, whose phase depends on the magnitude to be measured.

FIG. 11 shows the various directions of polarisation and frequencies of the sub-beams associated with the sub-strate-grating image $WG'_1$ and the mask grating $RG_1$. Each of the sub-beams $b_1(0)$, $b_1(-1)$ and $b_1(+1)$ issuing from the substrate grating $WG_1$, not shown, comprise two beam components having mutually perpendicular directions of polarization, indicated by the arrows 30 and 31. The beam component having the direction of polarization 30 has a radiation frequency $\omega_1$ and the beam component having the direction of polarisation 31 has a radiation frequency $\omega_2$. In the path of the zero-order sub-beam $b_1(0)$ a $\lambda/2$ plate HWP is arranged, which plate rotates the directions of polarization of the beam components through 90° relative to those of the corresponding components in the sub-beams $b_1(+1)$ and $b_1(-1)$. Therefore, the directions of polarization of the beam components of the frequencies $\omega_1$ and $\omega_2$ of the sub-beams $b_1(0,+1)$ and $b_1(0,-1)$ selected for detection are rotated through 90° relative to the directions of polarization of the corresponding components of the sub-beams $b_1(+1,0)$ and $b_1(-1,0)$.

In order to enable the different directions of polarisation to be spatially separated, polarisation analysers may be used which are situated in two mutually perpendicular positions, in which the directions of the optic axes correspond to the two directions of polarisation of the sub-beams. However, preferably use is made of polarisation-separating elements such as polarization-separating prisms or Wollaston prisms. In FIG. 11 these Wollaston prisms bear the reference numerals 40 and 40' and the optic axes of these prisms bear the numerals 41 and 42. These prisms split each of the sub-beams in two sub-beam components having mutually perpendicular directions of polarisation. In the present embodiment four detectors $D_{20}$, $D_{21}$, $D_{22}$ and $D_{23}$ are provided for each illumination beam $b_1$ and $b_2$. On each of the detectors $D_{20}$ and $D_{21}$ both the sub-beam $b_1(+1,0)$ and the sub-beam $b_1(0,+1)$ are incident and on the detectors $D_{22}$ and $D_{23}$ both the sub-beams $b_1(0,-1)$ and the sub-beam $b_1(-1,0)$ are incident.

In FIG. 11 the angles at which the sub-beams are reflected by the Wollaston prisms and the focussing error $\Delta Z$ are shown to an enlarged scale but in reality these angles $\Delta Z$ are much smaller. For the image of the substrate grating $WG_2$ formed on the mask grating $RG_2$ by means of the beam $b_2$ a Figure similar to FIG. 11 applies, four detectors $D_{25}$, $D_{26}$, $D_{27}$ and $D_{28}$ again being arranged at locations analogous to the locations of the detectors $D_{20}$, $D_{21}$, $D_{22}$ and $D_{23}$ in FIG. 11. In the device shown in FIG. 11 the sub-beams $b_1(+1,-1)$, $b_1(0,+1)$ and the sub-beam $b_1(-1,+1)$, $b_1(0,-1)$ may also be used for detection instead of the aforementioned sub-beams, in the same way as in the device shown in FIGS. 8 and 10.

The time-dependent output signals from the detectors $D_{20}$, $D_{21}$, $D_{22}$ and $D_{23}$ may be represented by:

$$SI_{20} = A \cos(\Delta\omega t + \gamma F - \gamma M,1)$$

$$SI_{21} = A \cos(\Delta\omega t - \gamma F - \gamma M,1)$$

$$SI_{22} = A \cos(\Delta\omega t + \gamma F - \gamma M,1)$$

$$SI_{23} = A \cos(\Delta\omega t - \gamma F - \gamma M,1)$$

Replacing $\gamma M,1$ by $\gamma M,2$ in this expression yields the detector signals $SI_{25}$, $SI_{26}$, $SI_{27}$ and $SI_{28}$. From the signals $SI_{20} - SI_{23}$ and $SI_{25} - SI_{28}$ the same information can be derived as is described with reference to FIG. 10.

Instead of a Zeeman laser it is possible to use a radiation source supplying a linearly polarised beam. A modulator MO, for example an elasto-optical modulator, should then be arranged in the path of this beam, as is indicated in FIG. 9a. Care is taken that the direction of polarization of the beam $b_1$ makes an angle of 45° with the optic axis of the modulator. If the modulator is energised with periodic signal $\cos(\delta t)$ the birefringence $\psi$ of the modulator changes in conformity with $\delta = \delta_0 \cos(\psi t)$. The beam $b_1$ issuing from the modulator then has two components having mutually perpendicular directions of polarization and exhibiting a phase difference which is time-modulated in conformity with $\delta_0 \cos(\psi t)$. In the same way as is shown in FIG. 11, the sub-beams formed from this beam after traversing the gratings $WG'_1$ and $RG_1$ are separated in conformity with their directions of polarization and are incident on four detectors. The output signals of these detectors are now:

$SI_{20} = B \cos(\delta_{o'} \cos(\psi t) + \gamma F - \gamma M, 1)$ $SI_{21} = B \cos(\delta_{o'} \cos(\psi t) - \gamma F - \gamma M, 1)$ $SI_{22} = B \cos(\delta_{o'} \cos(\psi t) + \gamma F - \gamma M, 1)$ $SI_{23} = B \cos(\delta_{o'} \cos(\psi t) - \gamma F - \gamma M, 1)$ Replacing of $\gamma M, 1$ by $\gamma M, 2$ again yields the signals $SI_{25}$ to $SI_{28}$. Again the signals $SI_{20} - SI_{24}$ and $SI_{25} - SI_{28}$ contain the same information as the corresponding signals obtained by means of the device shown in FIG. 11.

A modification of the embodiment which is related to the embodiments described with reference to FIGS. 9, 10 and 11 will now be described with reference to FIGS. 12 and 13. This device has the advantage that the $\lambda/2$ plate HWP need no longer be arranged between the substrate and the mask, so that in the design of the projection-lens system no allowance has to be made for this plate and that for the magnification measurement the coupling mirror MR in FIG. 9a need no longer be arranged in the path of the projection beam PB. However, it is now necessary that the radiation source produces a beam of high intensity and that the elements, to be described hereinafter, in the detection branch can be positioned with high accuracy.

In the device shown in FIGS. 12 and 13 the mask gratings have a smaller period than 1/M times the period of the substrate gratings. The angle at which the first-order sub-beams are diffracted by a mask grating are then larger than the angle at which the substrate grating diffracts the first-order sub-beams. The grating periods are selected in such a way that the sub-beams $b_1(+1)$ and $b_1(-1)$ formed by the substrate grating $WG_1$ can just pass through the pupil PU of the projection-lens system PL. The first-order sub-beams $b'_1(+1)$ and $b'_1(-1)$ produced upon the first passage through the mask grating $RG_1$ can then no longer pass through the projection-lens system. Therefore, the substrate gratings are only illuminated by the zero-order beams $b'_1(0)$ and $b'_2(0)$ of the illumination beams $b_1$ and $b_2$ which are incident on the mask gratings $RG_1$ and $RG_2$ from the left. The beams $b'_1(0)$ and $b'_2(0)$ are again split into a zero-order sub-beam and two first-order sub-beams by the substrate gratings $WG_1$ and $WG_2$, so that after the passage through the mask gratings $RG_1$ and $RG_2$ each beam $b_1$, $b_2$ again has the same number of diffraction orders as in the devices shown in FIGS. 8, 10 and 11. FIG. 13 shows the sub-beams $b_1(0,+1)$, $b_1(+1,0)$ and $b_1(-1,0)$ and $b_1(0,-1)$ employed for detection. This Figure also shows the additional elements used in the detection branch.

Again the zero-order sub-beam $b_1(0)$ and the first-order sub-beams $b_1(+1)$ and $b_1(-1)$ originate from the substrate grating, not shown and are diffracted at an angle $\theta$. Each of these sub-beams has two components with directions of polarization which are perpendicular to each other and with different radiation frequencies $\omega_1$ and $\omega_2$ if a Zeeman laser is used as the radiation source. Again it is possible to employ a combination of a radiation source emitting a linearly polarized beam and an elasto-optic modulator. The direction of polarization of each sub-beam then varies periodically in time. The mask grating $RG_1$ splits each of said beams into a zero-order sub-beam and two first-order sub-beams. Since the period of the mask grating is k/M times the period of the substrate grating, k being smaller than 1, for example ½, the diffraction angle $\theta$ of the mask grating is 1/k times the diffraction angle of the substrate grating. In order to provide a better overlap of the sub-beams $b_1(0,+1)$ and $b_1(+1,0)$ and the sub-beams $b_1(0,-1)$ and $b_1(-1,0)$, deflection elements, for example wedges WE, WE', may be arranged in the path of these beams. In order to ensure that only the desired sub-beams reach the detectors $D_{20}$, $D_{21}$, $D_{22}$ and $D_{23}$ a filter FI is provided, which filter stops the sub-beams $b_1(-1,-1)$, $b_1(+1,-1)$, $b_1(0,0)$, $b_1(-1,+1)$ and $b_1(+1,+1)$. The plane of the mask grating $RG_1$ is imaged in the plane of an axiliary grating AG by means of a lens $L_4$. The grating period of this grating is adapted to the period of the interference pattern which is formed at the location of this grating by the interfering sub-beams, which make specific angles with one another. The grating period of this auxiliary grating should be such that the diffraction angle $\theta'$ is equal to the angle $(k'-1) \cdot \theta$ between the beams $b_1(0,+1)$ and $b_1(+1,0)$. This grating period is given by:

$$P_{AG} = \frac{M_4}{\sin(k'-1) \cdot \theta}$$

where $M_4$ is the magnification of the lens $L_4$ and $k' = 1/k$. Now a $\lambda/2$ plate HWP is arranged behind the mask grating $RG_1$ and only in the path of the sub-beam $b_1(0,+1)$ and $b_1(0,-1)$. This plate has the same function as the $\lambda/2$ plate in the device shown in FIGS. 9, 10 and 11. Between the auxiliary grating AG and the detectors a polarization-separating element, for example a Wollaston prism WP is arranged, which prism spatially separates the beam components having mutually perpendicular directions of polarization, so that these components can be received by separate detectors in the same way as in the device shown in FIG. 11.

The detector signals $SI_{20} - SI_{23}$ and $SI_{25} - SI_{28}$ are similar to the corresponding signals obtained in the device shown in FIG. 11.

The time modulation of the detector signals for the device shown in FIG. 2 and described with reference to FIGS. 4 and 5 may also be employed in a device utilising reflected radiation. FIG. 14 shows such a device. This device does not employ mask gratings and polarisation means nor does it utilise movements of the gratings relative to each other. The substrate gratings $WG_1$ and $WG_2$ are illuminated by the beams $b_1$ and $b_2$ by windows $WI_1$ and $WI_2$ in the mask. The sub-beams of different diffraction orders reflected by the substrate gratings traverse the projection-lens system PL and image the gratings on the window. Semitransparent mirrors $BS_1$ and $BS_2$ are arranged in the paths of the beams $b_1$ and $b_2$ to direct a part of the radiation reflected by the substrate gratings towards an array of radiation-sensitive detectors $DA_1$ and $DA_2$. The lenses $L_5$ and $L_6$ and the lenses $L'_5$ and $L'_6$ respectively image the substrate gratings $WG_1$ and $WG_2$ on the associated detector array. Filters SF, SF' are arranged between these lenses and transmit only the desired diffraction orders. The detector arrays have the same construction and the signals from the detectors are processed in the same way as described with reference to FIGS. 2, 4 and 5.

The fact that the invention has been described when utilized in an apparatus for the repeated exposure of a substrate by a mask pattern does not imply that it is limited thereto. The magnification-error detection in accordance with the invention may be employed in systems in which very fine details should be imaged with a high dimensional accuracy and in which ambient parameters can influence the imaging quality and in systems in which different patterns have to be imaged onto one another.

What is claimed is:

1. A device for detecting magnification errors in an optical imaging system comprising a main lens system for conjugating an object plane and an image plane to each other, said image plane having a first and a second image grating said main lens system being telecentric at one side, wherein a first and a second object grating, each with a predetermined grating period, are arranged in the object plane and are intended to be imaged by the main lens system on said first and said second image grating respectively, said image gratings each having a grating period proportional to that of its associated object grating, a radiation source producing illumination beams for illuminating the gratings, and a first and a second radiation-sensitive detection system respectively arranged in the path of the illumination beam issuing from the first object grating and the first image grating and in the path of the illumination beam issuing from the second object grating and the second image grating, said detection systems converting these beams into two periodic electric signals whose phase differences are representative of the magnification errors.

2. A device as claimed in claim 1, wherein both the object gratings and the image gratings have strips and whereby the grating strips of an object grating and those of an associated image grating are moved periodically relative to each other in a direction perpendicular to the longitudinal direction of the grating strips.

3. A device as claimed in claim 2, including a drive means for one of two associated object gratings and image gratings for periodically moving said grating relative to each other.

4. A device as claimed in claim 3, wherein at least one of the detection systems comprises two detectors, a phase difference between the outpt signals of these detectors indicating a coarser magnification error which corresponds to a displacement of the grating strips of a grating relative to those of a grating imaged thereon by at least half a grating period.

5. A device as claimed in claim 1, wherein the grating to be moved and with the associated radiation-sensitive detection system together comprise an array of radiation-sensitive detectors, which array covers m grating periods of the grating imaged thereon and comprises n detectors for every grating period and in that each detector of the sequence number i is interconnected to a detector of the sequence number i+n, where i=1, 2, 3, ... n(m−1).

6. A device as claimed in claim 1, 2, 3, 4 or 5, wherein the object gratings and the image gratings are transmission gratings and in that the radiation source is arranged at one side of the main lens system before the gratings situated at this side, and the radiation-sensitive detection systems at the other side of this lens system are arranged behind the gratings disposed at this other side.

7. A device as claimed in claim 1, 2, 3, 4 or 5, wherein either the image gratings or the object gratings are reflection gratings and the other gratings are transmission gratings, in that the radiation-sensitive detection systems are arranged at that side of the transmission gratings which is remote from the reflection gratings, and in that in each of the illumination beams a beam splitter is arranged for separating from the illumination beam a radiation beam which originates from the reflection grating and which has twice traversed the main lens system and for directing the second-mentioned beam towards the radiation-sensitive detection system.

8. A device as claimed in claim 1, wherein the illumination beams have an aperture angle which is smaller than the diffraction angle at which the first-order sub-beams are diffracted by the gratings and in that for each illumination beam there are provided at least two radiation-sensitive detectors, the first detector being arranged in the path of both the $(0,+1)$-order sub-beams and one of the $(+1,0)$ and $(+1,-1)$ order sub-beams, whilst the other detector is arranged in the path of both the $(0,-1)$ order sub-beam and one of the $(-1,0)$ and $(-1,+1)$ order sub-beams, the first and the second numeral referring respectively to the first and the second grating in the radiation path of the relevant illumination beam.

9. A device as claimed in claim 8, characterized in that the period of an object grating is equal to 2/M times that of the associated image grating and in that the detectors are arranged in the path of the $(+1,-1)$ and $(0,+1)$ order sub-beams and in the path of the $(-1,+1)$ and $(0,-1)$ order sub-beams respectively, where M is the magnification of the lens system.

10. A device as claimed in claim 8 or 9, including a drive means for periodically moving one of two associated object gratings and image gratings relative to each other.

11. A device as claimed in claim 8 or 9, characterized in that in the path of each of the illumination beams a $v.\lambda/2$ plate is arranged in the zero-order sub-beam originating from the first grating, where v is an odd number and $\lambda$ is the wavelength of the radiation used, for converting the state of polarization of this sub-beam into the orthogonal state relative to the state of polarisation of the first-order sub-beams originating from this grating.

12. A device as claimed in claim 11, characterized in that for each illumination beam two $\lambda/4$ plates and a rotating polarisation analyser are arranged in the radiation path between the last grating traversed and the associated detectors.

13. A device as claimed in claim 11, characterized in that each illumination beam comprises two components having mutually perpendicular directions of polarization and having different radiation frequencies, in that for each illumination beam there are provided four radiation sensitive detectors, and in that polarization-separating elements are arranged in the radiation path of the sub-beams between the last grating traversed and the detectors.

14. A device as claimed in claim 11, characterized in that each illumination beam is a linearly polarized beam whose direction polarization varies periodically between two mutually perpendicular states, in that for each illumination beam there are provided four radiation-sensitive detectors, and in that polarization-separating elements are arranged in the radiation path of the sub-beams between the last grating traversed and the detectors.

15. A device as claimed in claim 13, characterized in that the grating period of an object grating is equal to k/M times the grating period of the associated image grating, where k is a number smaller than one, and in that in the detection branch for each illumination beam in each sub-beam which is diffracted in a first order by the last grating traversed there are arranged, in this order: the $n.\lambda/2$ plate, a lens which images the grating plane on an auxiliary grating between said lens and the detectors, and a polarization-separating element between the auxiliary grating and the detectors.

16. An apparatus for the repeated imaging of a mask pattern onto a substrate, comprising a mask table, a substrate table and a protection-lens system interposed between said tables, characterized by a magnification-error detection device as claimed in any one of claims 1,2,3,4 or 5 the main-lens system comprising the projecting lens system and the axial position of the mask table being adjustable relative to the projection-lens system and the substrate table by means of the magnification-error signal supplied by the magnification-error detection device.

17. An apparatus as claimed in claim 16, characterized in that the radiation source for the magnification-error detection device is constituted by the radiation source employed for the repeated imaging of the mask pattern onto the substrate.

18. A device as claimed in claim 14, characterized in that the grating period of an object grating is equal to k/M times the grating period of the associated image grating, where k is a number smaller than one, and in that in the detection branch for each illumination beam in each sub-beam which is diffracted in a first order by the last grating traversed there are arranged, in this order: the $v.\lambda/2$ plate, a lens which images the grating plane on an auxiliary grating between said lens and the detectors, and a polarization-separating element between the auxiliary grating and the detectors.

* * * * *